United States Patent [19]
Chi-Yung et al.

[11] Patent Number: 5,777,919
[45] Date of Patent: Jul. 7, 1998

[54] SELECT GATE ENHANCED HIGH DENSITY READ-ONLY-MEMORY DEVICE

[75] Inventors: Wu Chi-Yung, Hsin Chu, Taiwan; Ling Chen, Sunnyvale, Calif.; Tony Peng, Miaoli, Taiwan

[73] Assignee: Holtek Microelectronics, Inc., Hsinchu, Taiwan

[21] Appl. No.: 713,741

[22] Filed: Sep. 13, 1996

[51] Int. Cl.$^6$ .................................................. G11C 17/00
[52] U.S. Cl. .............................. 365/104; 365/51; 365/63
[58] Field of Search .............................. 365/51, 63, 226, 365/104

[56] References Cited

U.S. PATENT DOCUMENTS 5,268,861  12/1993  Hotta ........................................ 365/104

*Primary Examiner*—David C. Nelms
*Assistant Examiner*—Hoai V. Ho
*Attorney, Agent, or Firm*—W. Wayne Liauh

[57] ABSTRACT

The present invention is related to an enhanced high density Read-Only-Memory (ROM) device with select gate. A thin oxide layer is deposited on the ROM cell matrix and it is extended to the select lines which is on the top and bottom side of the ROM cell matrix to form the select gate. The ROM cell matrix can be organized more flexible by using the buried layers to pick out the unwanted gates. The metal contact can be directly made in this extended region too. Thereafter it reduces the manufacturing cost and achieves a high speed and density and simple process device.

5 Claims, 10 Drawing Sheets

5,777,919

SELECT GATE ENHANCED HIGH DENSITY READ-ONLY-MEMORY DEVICE

BACKGROUND OF THE INVENTION

1. Field of the Invention

This invention generally relates to the field of select gate enhanced high density Read-Only-Memory (ROM), and more particularly to a high density ROM with the select gate formed by using an extended region of a thin oxide layer with improved driving ability. The metal contact can be made in the said extended region directly and desired select gate can be preferred by employing different organization of buried N+ lines easily. Therefore a simpler process in fabricating select gate enhanced high density ROM is achieved.

2. Description of the Prior Art

Read-Only-Memory devices are widely used in household appliances as well as high-tech products. The optimization of the ROM device, especially to simplify the manufacture process, to increase the density and improve the yield, is the major objective of research and development of many providers.

U.S. Pat. No. 5,268,861 which describes a conventional matrix (N×M) is made up of N polysilicon word line WL1, WL2, ... WLN, and M+1 buried N+ line SB1 SB2, ... SBM+1, in a crisscross formation. And four select lines BO1, BO2, BE1, BE2 are used to form the select gate BSO1, BSO2, etc. Therefore the device can be extended to make multiple modules when necessary. However, there are some known semiconductor ROM cell roblems in the prior art as shown in FIG. 1:

(1) The size of the select gate is limited by the layout of the Buried N+ line and select line to be same as the size of the memory cell itself, this limits the enhancement of the driving ability of the select gate BSO1, BSO2, and the lowering of load resistance.

(2) Select gate BSO2 is opened to conduct the buried N+ line SB3 and MB1 when select line BO2 is activated. It is possible that instead the buried N+ line SB3 and SB1 are conducted due to the activation of the select line BO2. An error in the transmission of the signal can be caused.

(3) As described in the FIG. 1, the contacts of buried N+ line MB1, MB2, MB3, MB4 to metal are all formed directly. However, the electric leakage to substract will be caused because the diffusion depth of said buried N+ line is shallower than that of the ordinary N+ diffusion and the oxide layer above the said buried N+ line is thicker than the said thin oxide. Therefore the diffusion area of buried N+ lines has to be made wider and deeper before the metal contact is built in order to avoid this electric leakage phenomena as the prior art approach. This will rise the cost and complicate the process because an additional step is required.

Taiwan patent No. 81108348 exhibits a conventional select line high density parallel ROM device, as shown in FIG. 2. FIG. 3 shows the effective circuit of said select line high density parallel ROM. The primary characteristic of this device is the select line SL0, SL1 ... on top and bottom side of the word line WL'1, WL'2, etc., that include an extended region to form the select gate ST0, ST1, ... to achieve the high density required. However, the following disadvantages are found in this conventional high density parallel ROM with select gate:

(1) The resistance of the reading signal path is different when different memory element is selected. As shown in FIG. 4, the reading path of the select gate high density parallel ROM, in which the path resistance of memory cell T2 is twice R, while that of cell T4 is four times R. In analog of this, the reading path resistance of memory cell Tn, is 2n times R, which is much larger than that of cell T1 and T2. This situation expands the difficulty of designing the detective amplifier 10, and even causes misaction due to the instability of the fabrication process and affects the yield.

(2) The said conventional high density parallel ROM with select gate have the same issue mentioned in the defect (3) as mentioned above of the conventional semiconductor ROM devices, we don't remention here.

SUMMARY OF THE INVENTION

In view of foregoing, it is the principle object of the present invention to produce a thin oxide layer above the ROM cell matrix, this oxide layer has extended region that covers the select lines which are on the top and bottom of the ROM cell matrix to form the select gate with enhanced driving ability. The size of the select gate can be twice as big as the ROM cell and hence increase the driving ability of the select gate by a factor of two.

It is a further object of the invention to provide a process for making metal contact from the thin oxide extended region directly. Therefore the additional step for avoiding the electric leakage phenomena as mentioned in the prior art is not required.

Yet another object of this invention is to employ buried N+ line to choose the desired select gates. Afterwards the organization of ROM cell matrix can be more flexible because of different N+ structure performed.

In accordance with the objects of the invention, a method for providing a select gate enhanced high density ROM device is disclosed. That solves the problem of conventional ROM device and has easier fabrication process, higher density, faster speed and very good device yield.

BRIEF DESCRIPTION OF THE DRAWINGS

The accompanying drawings further form a martial part of the prior art and the invention.

DESCRIPTION OF THE PREFERRED EMBODIMENTS

Figure 5:
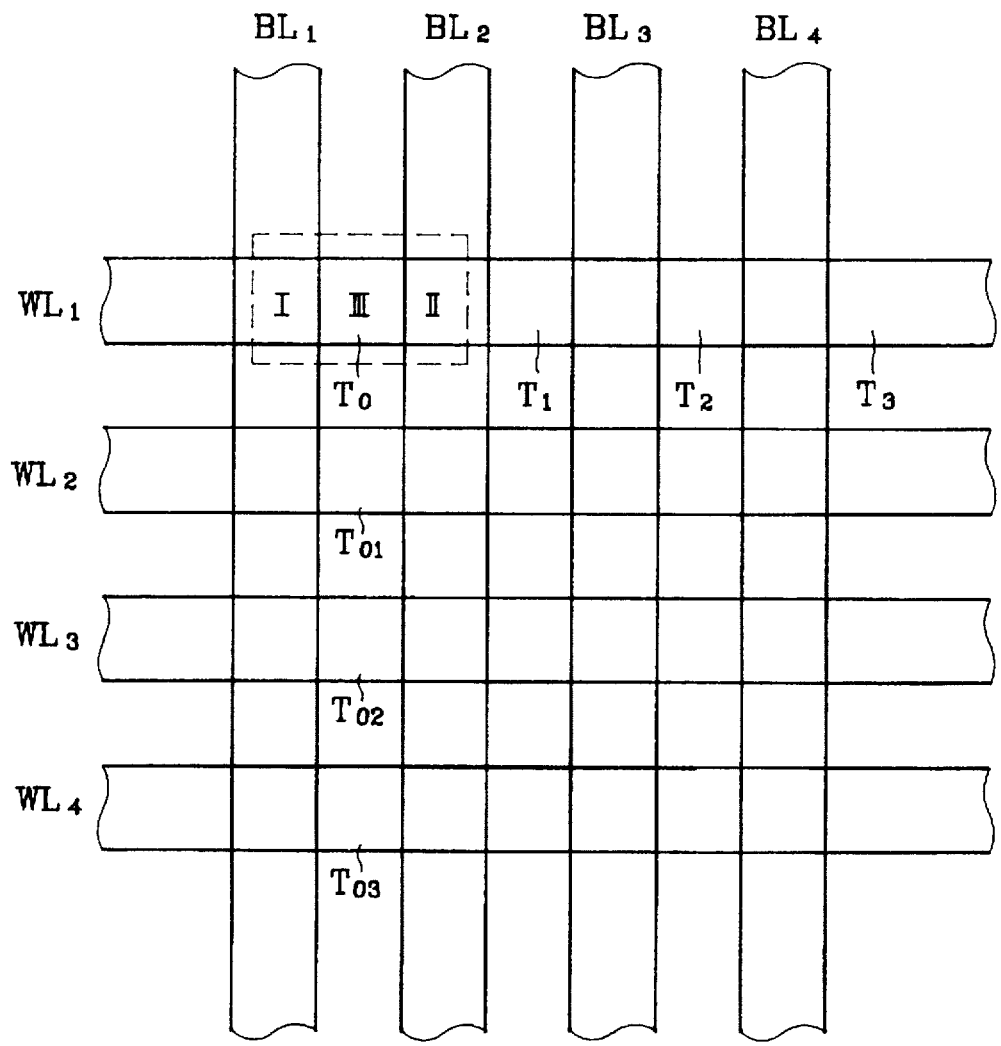
FIG. 5 shows the layout of the buried layer in the select gate enhanced high density ROM device of this invention.

The invention disclosed herein is directed to a design for a select gate enhance high density Read-Only-Memory Device, as shown in FIG. 5. T0 in the figure is one memory cell which is formed by the cross area of the polysilicon word line WL1 and buried N+ bit line BL1 and BL2. The drain and source electrodes of the memory cell T0 are the overlapping area I and II of polysilicon word line WL1 and buried N+ line BL1 and BL2. The overlapping region of the word line and bit line is insulated by oxide layer, and the gate electrode of the memory cell T0 is located on the polysilicon word line WL1. In analogy, one horizontal polysilicon word line and two vertical buried N+ bit line can form the memory cell T1, T2, T01, T02 . . . The ROM cell matrix of this invention is formed by this cross structure of a parallel set of horizontal polysilicon word line and a parallel set of vertical buried N+ bit line.

Figure 6:
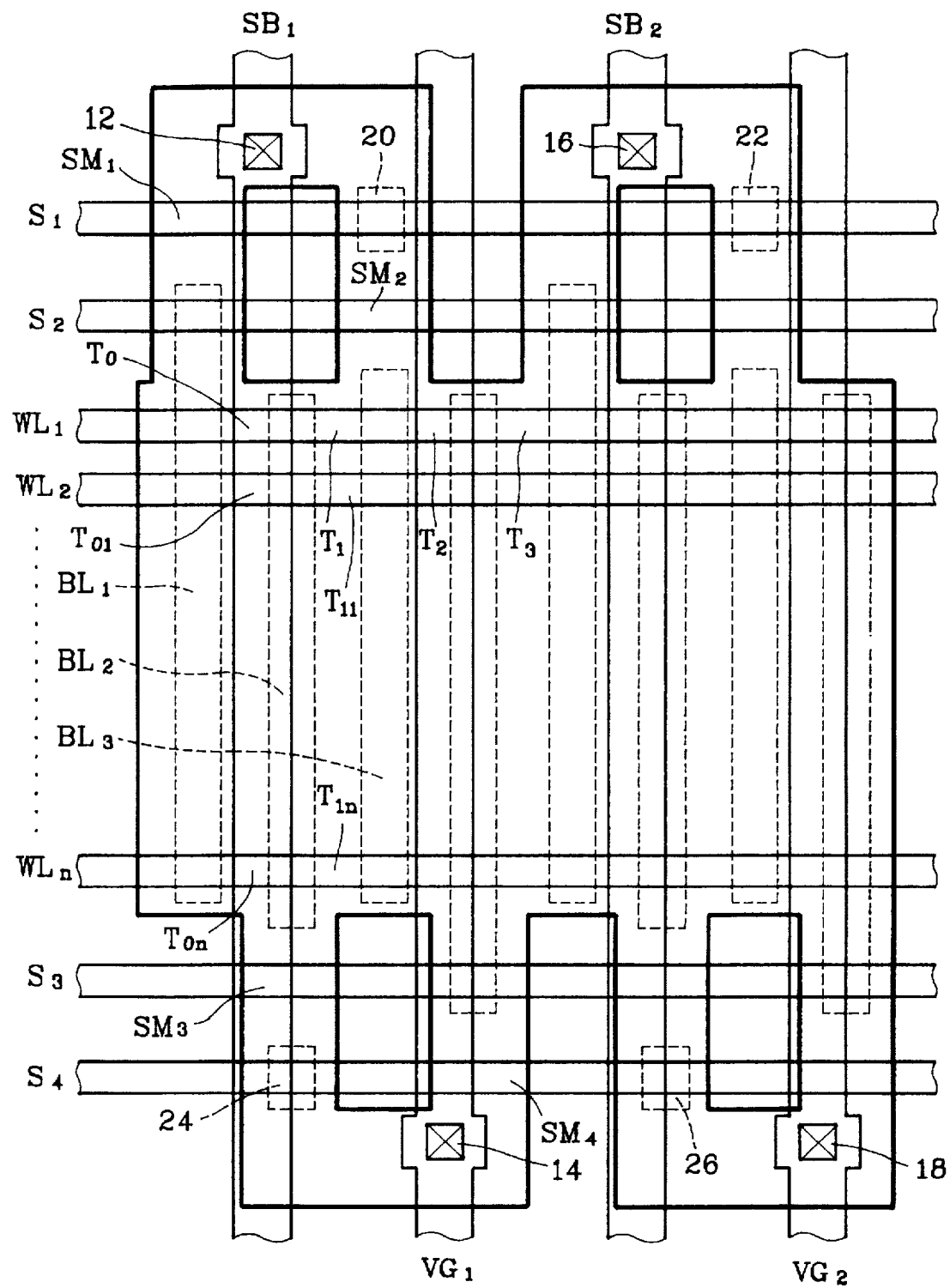
FIG. 6 shows layout of the select gate enhanced high density ROM device of this invention.

FIG. 6 shows the layout of the select gate enhanced high density ROM device of this invention. A set of select line S1, S2, S3, S4 which is perpendicular to the bit line BL1, BL2 . . . is positioned on top and bottom of the ROM matrix respectively. These select lines are used to pick out the areas of ROM devices and facilitate the high density extension of ROM devices. On the top plain of every other buried N+ line, metal lines SB1, VG1, SB2, VG2 are deposited to lessen the resistance load of the buried N+ bit line. The whole ROM matrix is covered with a layer of thin oxide (50) with extended regions. It extends to select lines which are on the bottom side of the ROM cell matrix to form the select gate SM1, SM2, SM3, SM4. Each buried layer N+ BL1, BL2, BL3 . . . has only one extended region to up side or down side. Since the extension of the thin oxide layer can be twice as wide as the buried N+ line, the select gate SM1, SM2, can be twice as large as the memory cell T0, T1, T2, . . . and its driving ability is enhanced by a factor of two. Besides the metal contact area 12, 14, 16, 18 can be formed in SB1, VG1, SB2, VG2 then connect by metal lines directly. And buried line N+ 20, 22, 24, 24 are employed to select the desired select gates.

Figure 7:
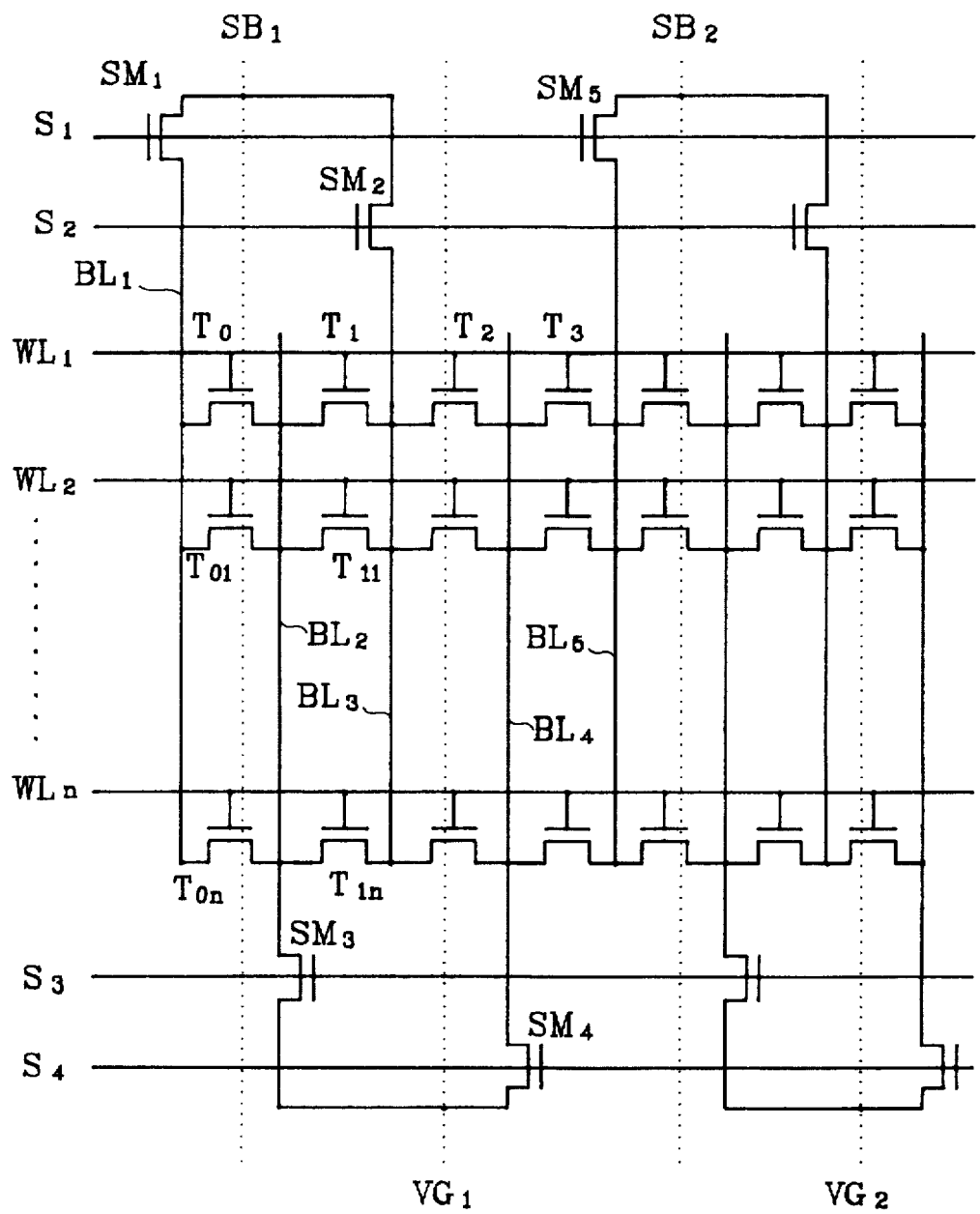
FIG. 7 shows the effective circuit of the select gate enhanced high density ROM device of this invention.
Figure 8:
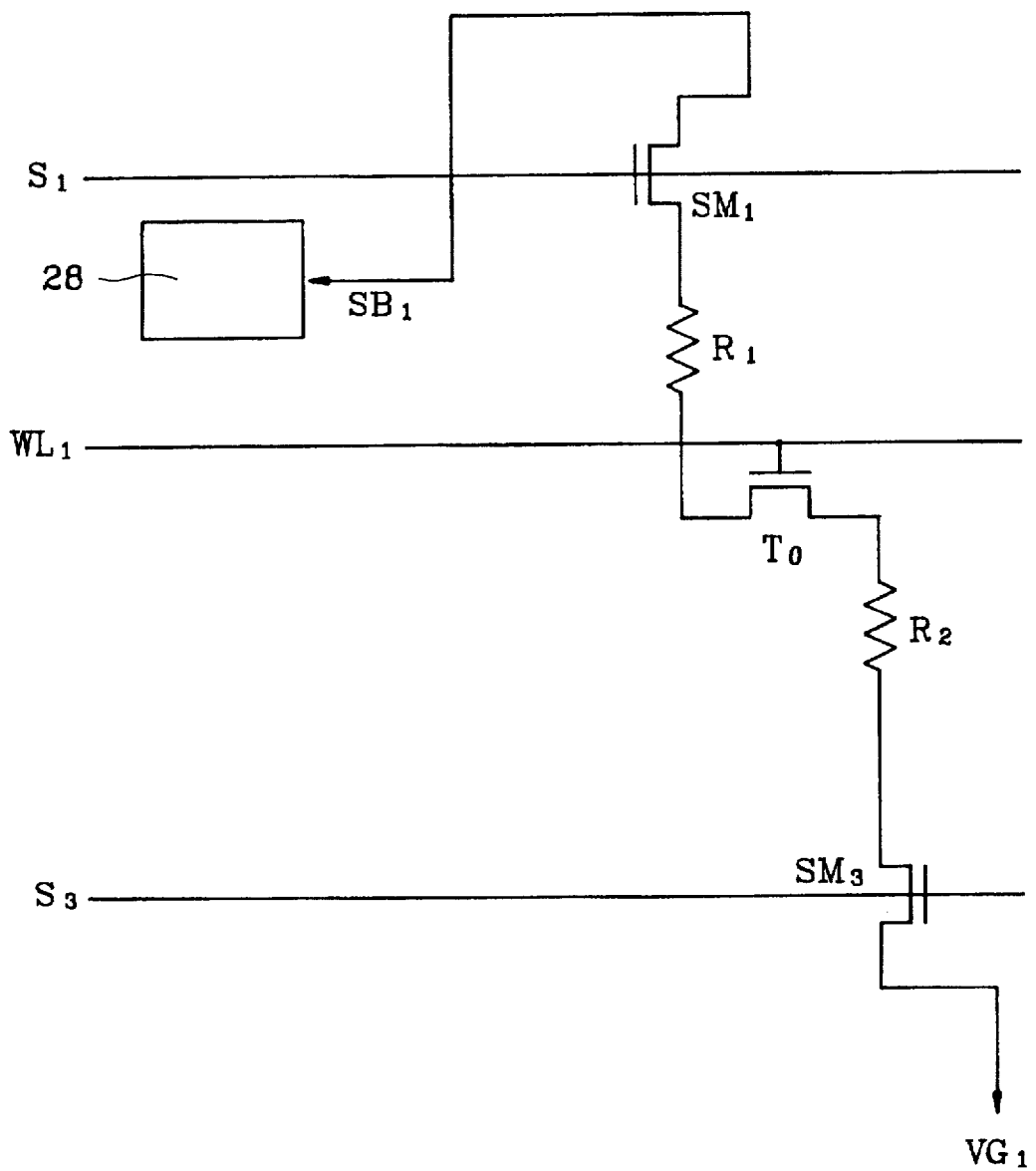
FIG. 8 shows the reading path of the select gate enhanced highdensity ROM device of this invention.

FIG. 7 shows the effective circuit of the select gate high density ROM device disclosed in the invention. SB1 and SB2 are bit lines. VG1 and VG2 are virtual ground lines and WL1, WL2, . . . WLn are word lines. S1, S2, S3 and S4 provide select lines. Every bit line can transmit 4 different sets data stored in the memory cell and it is described as following:

(1) For reading the signal stored in T0 memory cell: Connect word line WL1 of memory cell T0 to high voltage and keep the voltage of remaining word lines low. Actuate select gate SM1 by connecting select line S1 to high voltage, bit line SB1 to high voltage and the virtual ground line set to ground. Therefore Buried N+ bit line BL1 is connected to bit line SB1 through select gate SM1, and SB1 connected to sense amplifier 28 in parallel, as shown in FIG. 8. Connect S3 to high voltage to actuate SM3, therefore buried bit line BL2 is connected to virtual ground VG1 through select gate SM3. Make select gate SM2 and SM4 open by connecting select line S2 and S4 to low voltage, as shown in FIG. 8. Then connect the bit line SB2 and virtual ground VG2. The signal output will be "1" if memory cell voltage T0 is high threshold voltage and "0" vice versa.

(2) For reading the signal stored in T1 memory cell: Connect word line WL1 of T1 memory cell to high voltage and keep the voltage of remaining word lines low. Connect the select line S2 to high voltage to make select gate SM2 actuated. The bit line SB1 is connected to high voltage and virtual ground is set to ground. Therefore buried layer N+ bit line BL3 is connected to bit line SB1 through select gate SM2, and this bit line SB1 connects to sense amplifer in parallel. Then select line S3 connect to high voltage to make select SM3 actuated, and buried N+ bit line BL2 connect to select gate SM3 and virtual ground VG1 is grounded, make select line S1 and S4 connect to low voltage to open select gate SM1 and SM4. And connect bit line SB2 and virtual ground VG2. The signal output will be "1" if memory cell voltage T1 is high threshold voltage and "0" vice versa.

(3) For reading the signal stored in T2 cell Connect word line WL1 of memory cell T2 to high voltage and keep the voltage of remaining word lines low. Actuate select gate SM2 by connecting select line S2 to high voltage, bit line SB1 to high voltage and the virtual ground line VG1 set to ground. Therefore Buried N+ bit line BL3 is connected to bit line SB1 through select gate SM2, and SB1 connected to sense amplifier in parallel. Connect S4 to high voltage to actuate select gate SM4, therefore buried bit line BL4 is connected to virtual ground VG1 through select gate SM4. And the virtual ground VG1 is set to ground. Make select gate SM1 and SM3 open and the bit line SB2 and virtual ground VG2 is connected. The signal output will be "1" if cell voltage T2 is high threshold voltage and "1" vice versa.

(4) For reading the signal stored in T3 memory cell: Connect word line WL1 of memory cell T3 to high voltage and keep the voltage of remaining word lines low. Actuate select gate SM5 by connecting select line S1 to high voltage, bit line SB2 to high voltage and the virtual ground line VG1 set to ground. Therefore Buried N+ bit line BL5 is connected to bit line SB2 through select gate SM5, and SB2 connected to sense amplifier in parallel. Connect S4 to high voltage to actuate select gate SM4, therefore buried bit line BL4 is connected to virtual ground VG1 through select gate SM4. And the virtual ground VG1 is set to ground. Make select gate SM2 and SM3 open and the bit line SB1 and virtual ground VG2 is connected. The signal output will be "1" if memory cell voltage T3 is high threshold voltage and "0" vice versa.

(5) Thereafter the signal of any memory cell can be read out analogically.

Therefore a Select Gate Enhanced High Density Read-Only-Memory Device is disclosed and it has the following advantages:

(1) The enchanced select gate is achived by employing a thin oxide layer entended region. The select gate SM1, SM2,SM3 and SM4, as shown in FIG. 6, can be twice as large as the memory cell and its driving ability is enhanced by a factor of two.

(2) Metal contact can be made directly from the thin oxide extended region and connect out by metal line. Electric leakage phenomena is not existing therefore that simplify the process.

(3) N+ buried line is employed to choose the undesired select gate. The organization of ROM cell matrix can be more flexible according to the different buried line structure.

Figure 1:
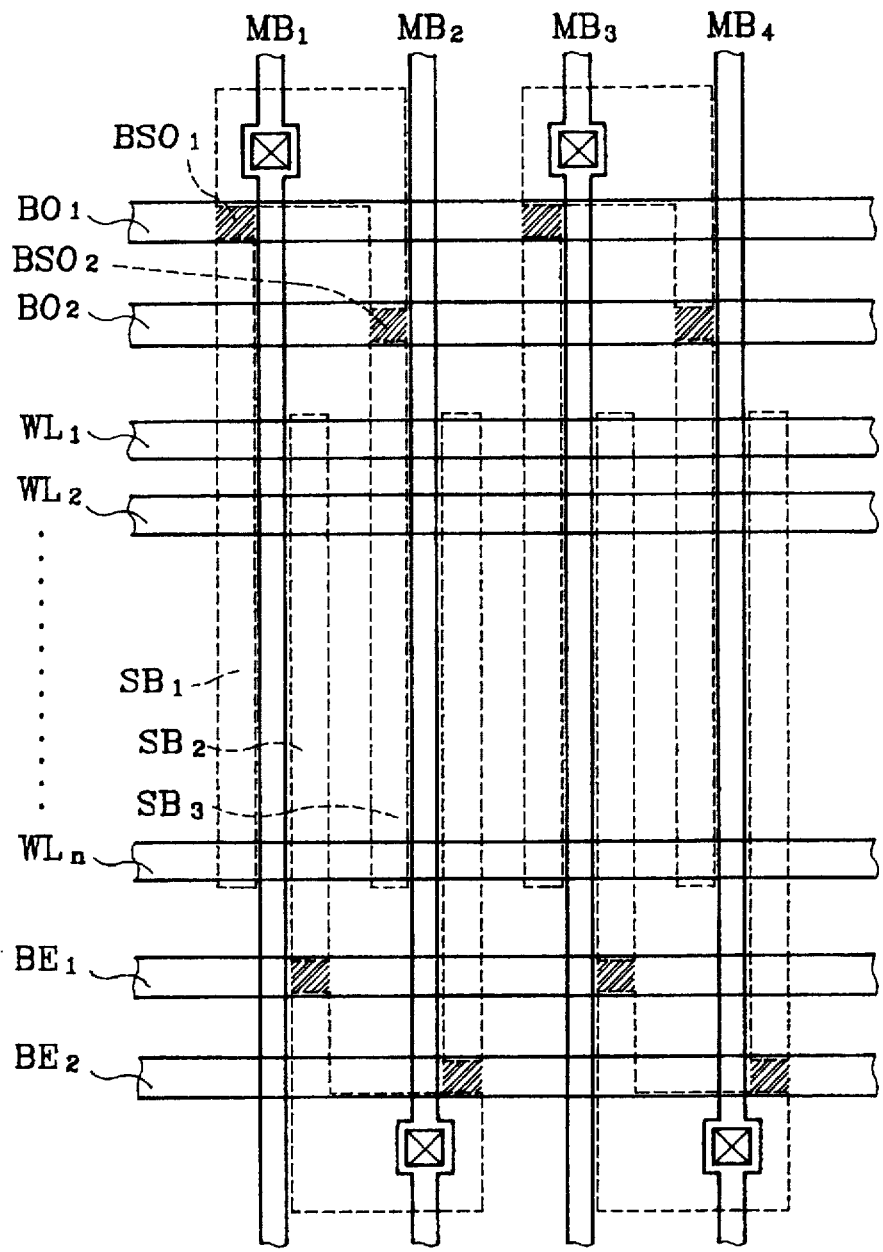
FIG. 1 shows the layout of conventional semiconductor ROM device.
Figure 2:
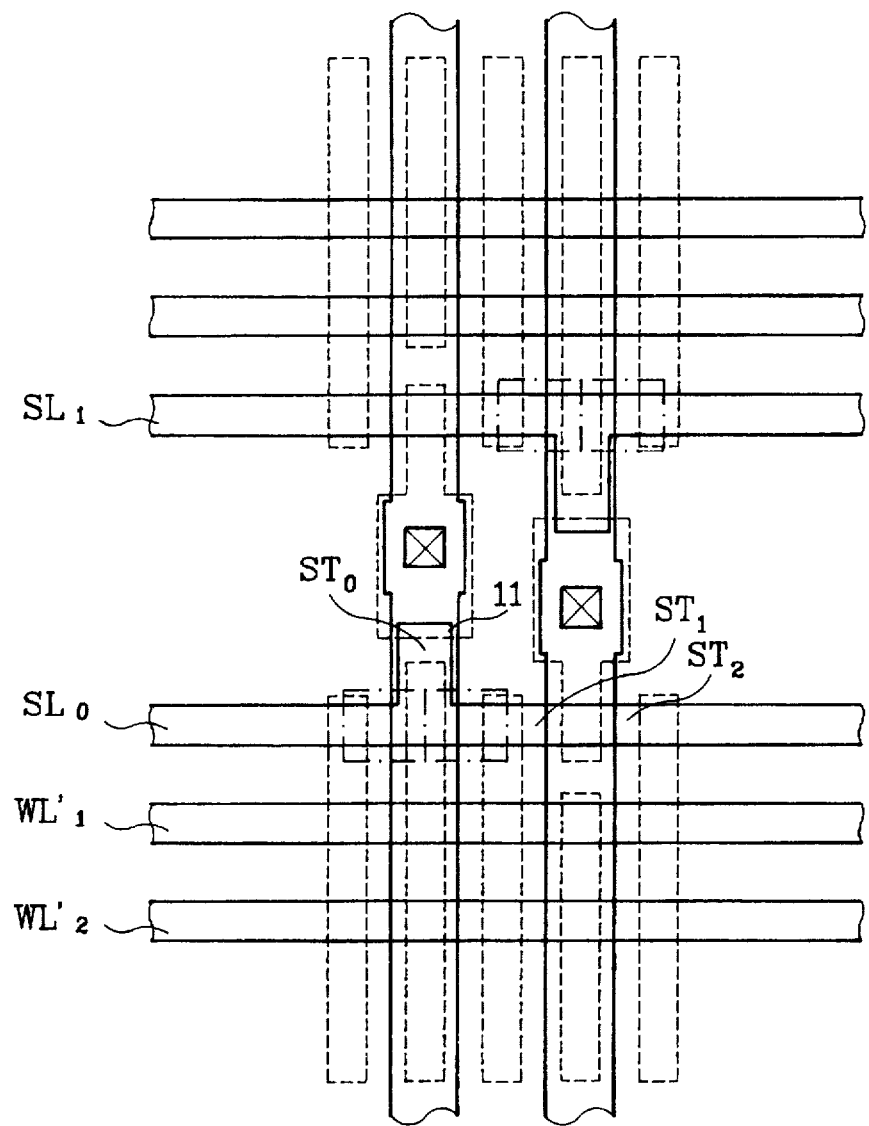
FIG. 2 shows the layout of conventional high density parallel ROM with select gate.
Figure 3:
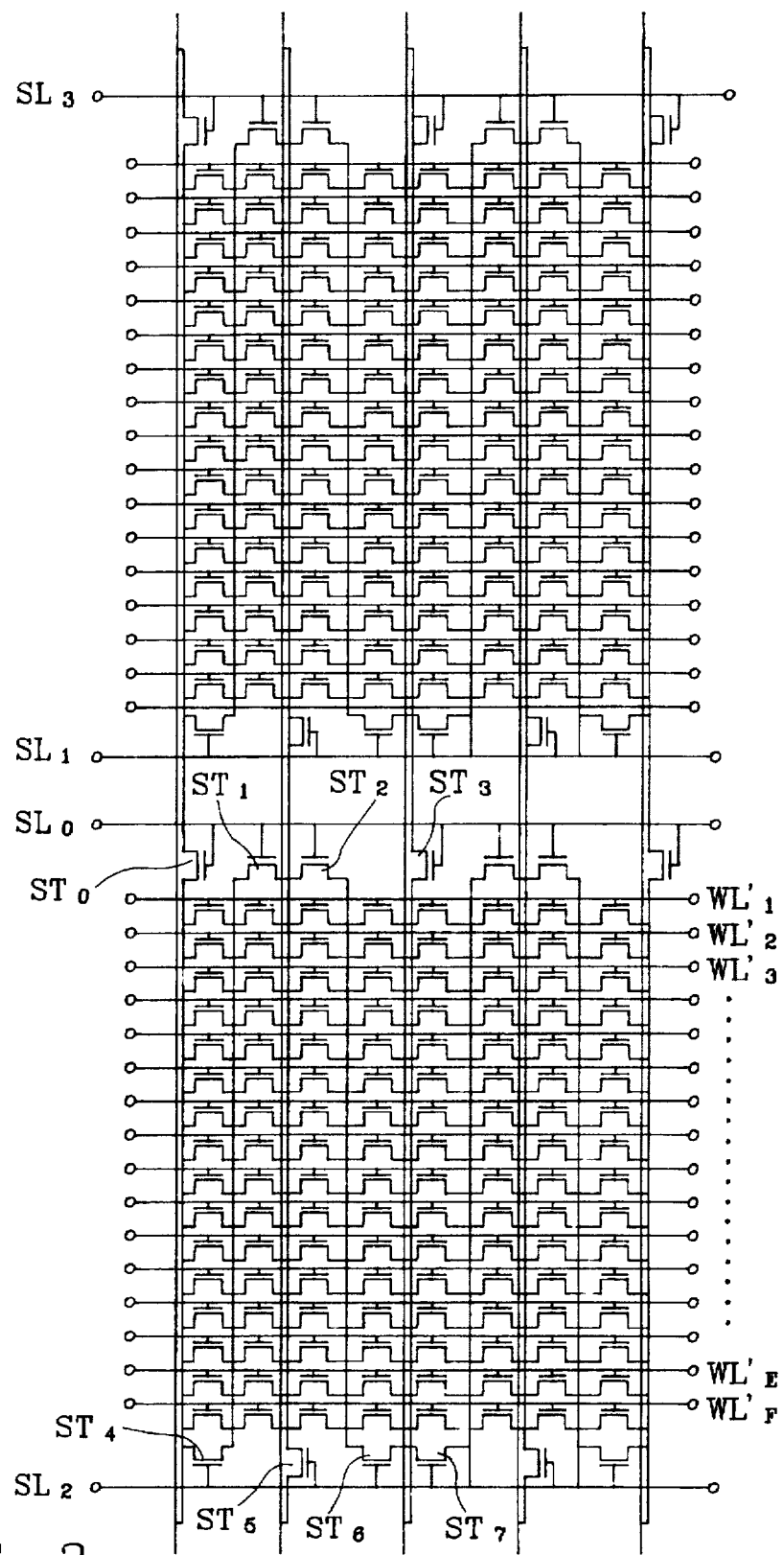
FIG. 3 shows the effective circuit of the conventional high density parallel ROM with select gate.
Figure 4:
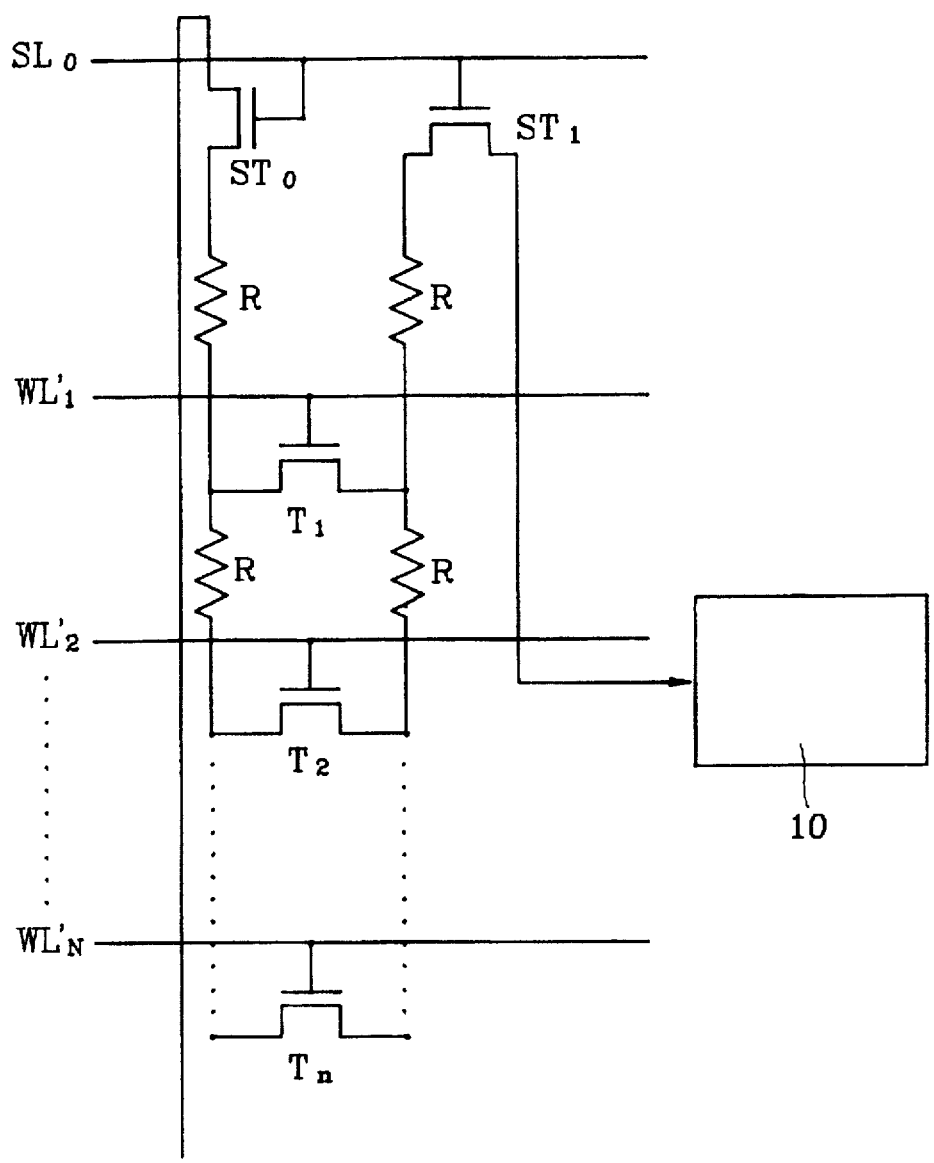
FIG. 4 shows the reading path of the conventional high density parallel ROM with select gate.
Figure 9:
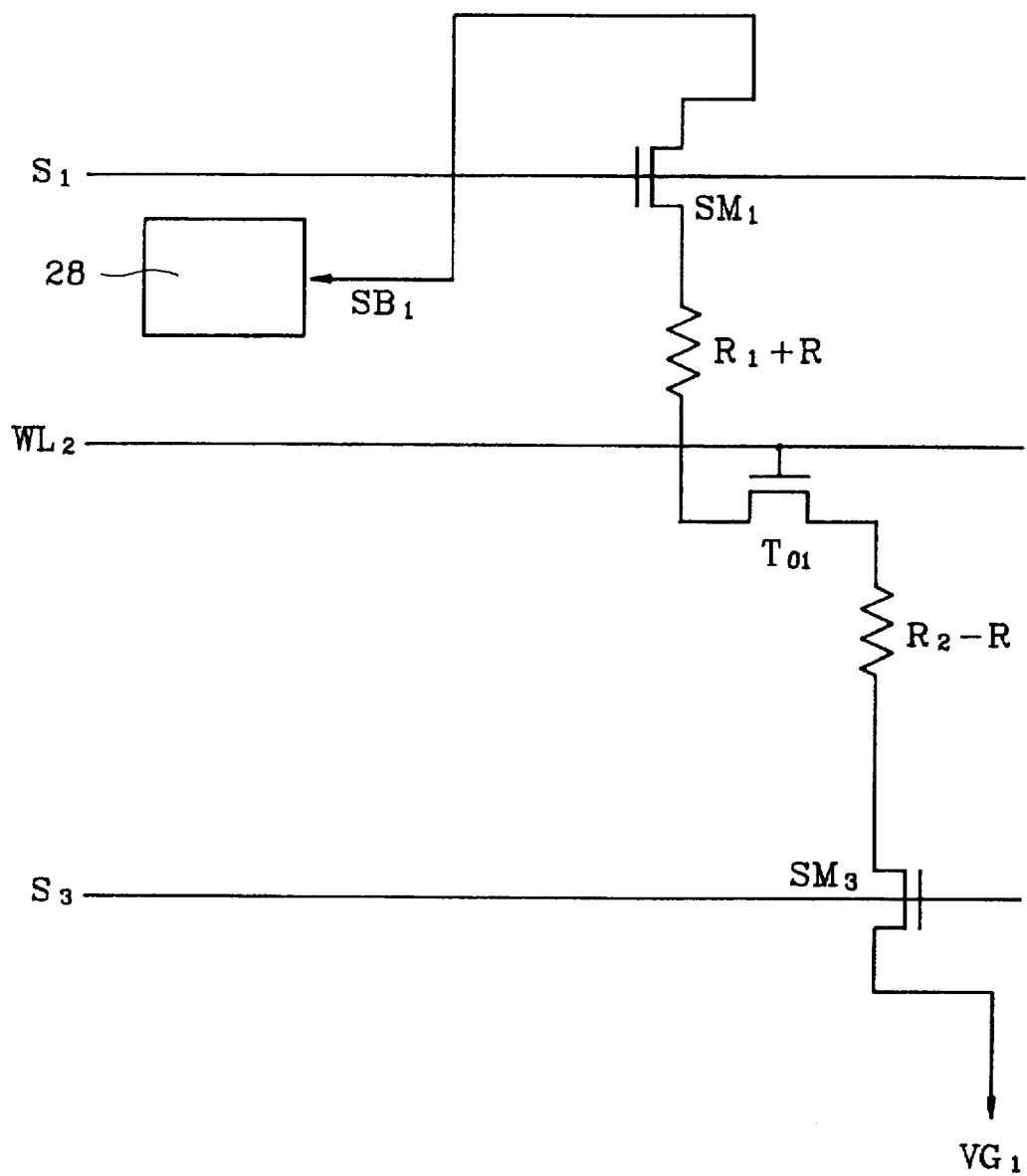
FIG. 9 shows another reading path of the select gate enhanced high density ROM device of this invention.
Figure 10:
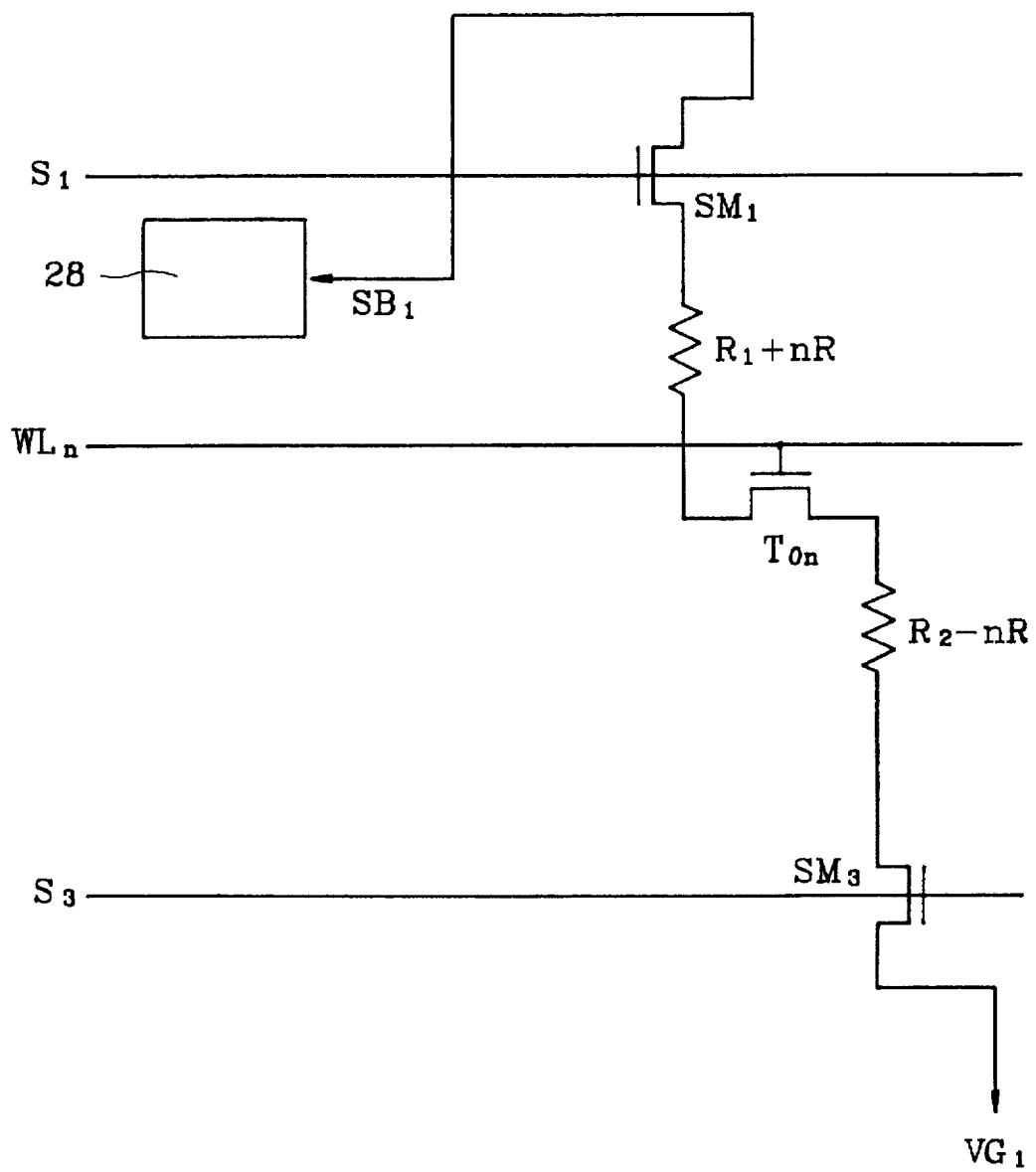
FIG. 10 shows yet another reading path of the select gate enhanced high density ROM device of this invention.

(4) The resistance of buried layer N+ will not be changed according to the signal read out from different memory cell. As shown in FIG. 8, the resistance is (R1+R2) if the signal of cell T0 is preferred. If we assume the resistance changing is R of each adjoining column of word line in sequence. As refer to FIG. 9, therewith the resistance is equal to [(R1+R)+(R2−R)]=R1+R2 if the signal of memory cell T01 is preferred. It is same as that reading from memory cell T0. As refereed to FIG. 10, the resistance will always be same through any different access and it will be [(R1+nR)+(R2−nR)]= R1+R2. This also described in FIG. 4.

While the invention has been particularly shown and described with reference to the preferred embodiments thereof, it will be understood by those skilled in the art that various changes in forms and details may be made without departing from the spirit and the scope of the invention.

What is claimed is:

1. A select gate enhanced high density read-only-memory device, comprising:

a plurality of word lines which are formed by a set of parallel horizontal polysilicon lines;

a plurality of bit lines which are formed by a set of parallel vertical buried N+ bit lines, wherein said bit lines are perpendicular to said word lines to form a ROM cell matrix;

a plurality of metal lines which are deposited above every other said N+ buried lines;

a plurality of select lines which are formed from polysilicon and located on top and bottom sides of said ROM cell matrix to select desired word lines and bit lines;

a thin oxide layer which is deposited above said ROM cell matrix;

an extended region in said thin oxide layer wherein said extended region includes an upper extension portion and a lower extension portion, said upper extension portion has a grated structure at positions corresponding to and at least partially overlapping every other said N+ buried lines, said lower extension portion has a similar grated structure at positions corresponding to and at least partially overlapping every other said N+ buried lines in an alternative manner;

further each of said buried N+ lines alternatively has an upwardly or downwardly extension to provide said overlapping with either said upper extension portion or said lower extension portion, respectively.

2. The read-only-memory device according to claim 1 wherein said extended region of said thin oxide layer is extended to said select lines to increase a driving ability of said select lines.

3. The read-only-memory device according to claim 1 wherein said extended region of said thin oxide layer contains a metal contact area for connection with said metal lines.

4. The read-only-memory device according to claim 1 wherein said extended region of said thin oxide has a width wider than that of said N+ lines.

5. The read-only-memory device according to claim 2 wherein said N+ buried lines are structures such that unwanted select gates are covered by some of said N+ buried lines.

* * * * *